United States Patent
Welch et al.

(10) Patent No.: US 6,381,724 B1
(45) Date of Patent: *Apr. 30, 2002

(54) METHOD AND APPARATUS FOR MODULATION ENCODING DATA FOR STORAGE ON A MULTI-LEVEL OPTICAL RECORDING MEDIUM

(75) Inventors: Lloyd R. Welch, La Canada; Terrence L. Wong, San Francisco, both of CA (US); Steve W. McLaughlin, Decatur, GA (US)

(73) Assignee: Calimetrics, Inc., Alameda, CA (US)

( * ) Notice: Subject to any disclaimer, the term of this patent is extended or adjusted under 35 U.S.C. 154(b) by 19 days.

This patent is subject to a terminal disclaimer.

(21) Appl. No.: 09/644,187

(22) Filed: Aug. 22, 2000

Related U.S. Application Data

(63) Continuation of application No. 09/083,699, filed on May 21, 1998, now Pat. No. 6,148,428.

(51) Int. Cl.[7] .............................................. H03M 13/00
(52) U.S. Cl. ........................................ 714/752; 370/204
(58) Field of Search ................................ 714/752, 746, 714/783, 701; 370/204; 341/29, 173; 340/825.62; 375/341, 346, 287, 286, 317, 308, 362

(56) References Cited

U.S. PATENT DOCUMENTS

| | | | |
|---|---|---|---|
| 3,706,842 A | 12/1972 | Robertson | 358/425 |
| 3,849,595 A | 11/1974 | Ishiguro | 358/262.1 |
| 4,217,467 A | 8/1980 | Kobayashi et al. | 375/269 |
| 4,860,012 A | 8/1989 | Heuvel et al. | 375/243 |
| 5,168,509 A | * 12/1992 | Nakamura et al. | 375/286 |
| 5,267,248 A | 11/1993 | Reyner | 714/736 |
| 5,448,592 A | 9/1995 | Willilams et al. | 375/261 |
| 5,459,709 A | 10/1995 | Bailey | 369/275.3 |
| 5,537,382 A | 7/1996 | McLaughlin et al. | 340/353 |
| 5,654,986 A | 8/1997 | Lim | 375/341 |
| 5,751,773 A | 5/1998 | Campana, Jr. | 275/346 |
| 5,818,806 A | 10/1998 | Wong et al. | 369/59 |
| 5,909,449 A | 6/1999 | So et al. | 714/721 |
| 6,034,996 A | 3/2000 | Herzberg | 375/265 |
| 6,148,428 A | * 11/2000 | Welch et al. | 714/752 |

OTHER PUBLICATIONS

Aikawa, S. et al. (150 KGate general–purpose high–coding–gain TCM VLSIs for high–speed multi–level QAM systems; IEEE; On pp. 1963–1967 vol. 3; Dec. 2–5, 1990).*

T. Kasami, T. Takata and T. Fujiwara, On Multilevel Block Modulation Codes, Jul. 4, 1991, IEEE Transactions on Information Theory, vol. 37, No. 4.

H. Imai and S. Hirakawa, A New Multilevel Coding Method Using Error–Correcting Codes, Apr. 12, 1976, IEEE Transactions on Information Theory, vol. IT–23, No. 3.

* cited by examiner

Primary Examiner—Albert Decady
Assistant Examiner—Guy J. Lamarre
(74) Attorney, Agent, or Firm—VanPelt & Yi LLP

(57) ABSTRACT

A system and method are disclosed for modulation encoding data for storage or transmission on a multilevel medium. The method includes encoding a first portion of data using a first tier modulation code. The first tier modulation code maps a first portion of the data onto a first set of symbols. A second portion of data is encoded using a second tier modulation code. The second tier modulation maps the second portion of the data onto a second set of symbols. The second tier modulation code has error correcting characteristics. A third set of symbols is determined based on the first set of symbols and the second set of symbols. The third set of symbols is suitable to determine nominal read signal levels from a multilevel medium. Improved error characteristics are realized for encoding data for storage or transmission on a multilevel medium.

40 Claims, 5 Drawing Sheets

METHOD AND APPARATUS FOR MODULATION ENCODING DATA FOR STORAGE ON A MULTI-LEVEL OPTICAL RECORDING MEDIUM

This is a continuation of application Ser. No. 09/083,699, now U.S. Pat. No. 6,148,428, filed May 21, 1998, which is hereby incorporated by reference.

BACKGROUND OF THE INVENTION

1. Field of the Invention

The present invention relates generally to methods and apparatuses for modulation encoding data for either storage on a multi-level recording medium or for transmission across a multi-level communication link. More specifically, the invention relates to a method of encoding data either to be stored on a multi-level optical storage disc which allows more than two potential data states to be stored at each physical location on the optical disc or to be transmitted across a communication link which allows more than two potential data states to be transmitted at any given time. As the number of potential data states stored or transmitted increases, the incidence of errors tends to increase when the maximum resolution of either the data writing/transmitting or data reading/receiving system is approached. The modulation encoding scheme described puts constraints on the data that is stored or transmitted in an attempt to maximize the number of potential data levels that can be read or received without the occurrence of an unacceptable number of errors.

2. Description of the Related Art

Current optical data storage discs store data in the form of marks which are formed on one surface of the disc. The mark is read by focusing a light source on the surface of the disc with the marks and detecting the intensity of reflected light from this surface. The intensity of light is generally converted to a voltage signal. When the light reflects off the disc surface where there is no mark, the light reflected from the disc is one value. For current read-only (ROM) discs, this is a high value since light is reflected from regions where there is no mark. However, when the light is incident on a mark, the light reflected from the disc surface is another value, which is typically a lower value for ROM discs. It is also possible to store more than one bit of information at each mark or symbol location by modulating the reflectivity of the marks. Such a disc is referred to as a multi-level (ML) modulated disc or, because the marks are actually pits in the case of current ROM discs, a pit depth modulated (PDM) disc. Read-only, write-once, and re-writable discs with multi-level reflectivity marks are possible using disc technologies similar to existing optical data storage technologies, such as compact disc (CD) or digital video disc (DVD).

ML or PDM discs are capable of storing more than 1 bit of data at each data storage position on the disc or mark. It should be noted that throughout this specification the terms "mark" and "storage position" are both used to describe a point on the disc where data is stored. Information states are defined for each mark and when a mark is read, then one of I information states is determined based on the mark that is read. Each potential information state may correspond to a symbol output by a modulation encoding scheme that converts data into symbols that are written to a multilevel media or transmitted across a multilevel transmission media. Thus, each mark may store one of I information states and without further coding, the number of bits, n, stored at each mark is $n = \log_2$.

Light reflected from one mark also tends to interfere with light reflected from another mark, especially when the marks are smaller than the reading laser spot of the optic stylus. This results in intersymbol interference (ISI). In other words, the signal from and location of one mark, therefore, tends to influence or interfere with the signal that is read from adjacent or neighboring marks. As the areal density of the marks increases, the ISI effect increases. A "modulation transfer function" (MTF) describes the transformation of the detected signal that results from the diffraction of light from neighboring pits. U.S. patent application Ser. No. 08/852,242, now U.S. Pat. No. 5,818,806, titled "Method and Apparatus for Providing Equalization for the Reading of marks on optical Data Storage Media" by Wong et. al., which is herein incorporated by reference for all purposes, describes a method and apparatus for providing equalization for a signal generated by reading a PDM disc. The method described compensates for intersymbol interference.

Even when the improved signal processing techniques described in Wong et. al. are used, it is nevertheless true that as the number of information states I that are stored increases, the more difficult it becomes to distinguish between the I different information states during reading. This increases the incidence of errors made in decoding the information stored in the marks.

FIG. 1 is an illustration of an ideal signal read from a PDM disc that has I=8 different information states. The y-axis indicates the intensity of the reflected light from the disc, and the x-axis indicates the distance, or length, traveled when reading the marks on the disc. Such a disc would be capable of storing 3 bits of information. No noise or intersymbol interference is included in the signal. For a real signal, the levels would include noise that would alter the signal level. Because of the precision of the measurement used to distinguish signal levels or because of the inherent system noise, the chance of error may be unacceptably high. The error rate could be significantly reduced if only two or four information states were possible for each mark instead of eight. However, this would of course decrease the amount of information that could be stored on the disc.

The problem of efficiently eliminating errors in such a situation is complex. Simply reducing the number of information states and thereby increasing the difference in signal output for different information states written to the disc would decrease the error rate, but at the cost of decreased density of data storage. Reducing the number of information states below 8 in the example given above would reduce the storage capacity of the system and would potentially be an inefficient use of the system.

Conventional compact discs utilize a modulation code that facilitates reading information from the disc as well as detecting and eliminating errors. In order to read information from a disc, the reading system must locate the marks, focus a reading laser on the disc surface, maintain accurate tracking of the laser over the tracks of marks, and recover timing information from the marks. Errors tend to occur when the disc is read. The problem of detecting and correcting errors on a PDM disc is different than error detection and correction on a conventional optical disc. Since the number of information states equals 2 in conventional discs, information is stored by modulating the length of the marks. When the signal level of the mark is modulated between more than two information states, the type of errors that occur changes. As a result, conventional modulation codes used in CD or DVD storage do not provide a way to effectively decrease the error rate while maximizing data storage capacity in a PDM environment.

Specific run length limited modulation encoding schemes for storing information on a multilevel optical recording medium are described in the following U.S. Patents:

U.S. Pat. No. 5,657,014 M=7(3,7) Run length Limited Code for Multilevel Data (1997).

U.S. Pat. No. 5,659,310 M=5(0,2) Run length Limited Code for Multilevel Data (1997).

U.S. Pat. No. 5,659,311 M=6(2,4) Run length Limited Code for Multilevel Data (1997).

U.S. Pat. No. 5,663,722 M=10(3,6) Run length Limited Code for Multilevel Data (1997).

U.S. Pat. No. 5,663,723 M=7(1,3) Run length Limited Code for Multilevel Data (1997).

U.S. Pat. No. 5,668,546 M=6(3,6) Run length Limited Code for Multilevel Data (1997).

U.S. Pat. No. 5,670,956 M=5(3,7) Run length Limited Code for Multilevel Data (1997).

U.S. Pat. No. 5,675,330 M=5(4,11) Run length Limited Code for Multilevel Data (1997).

U.S. Pat. No. 5,680,128 M=6(3,8) Run length Limited Code for Multilevel Data (1997).

U.S. Pat. No. 5,682,154 M=4(1,2) Run length Limited Code for Multilevel Data (1997).

U.S. Pat. No. 5,682,155 M=6(4,11) Run length Limited Code for Multilevel Data (1997).

These patents describe multilevel modulation codes that can have a specific number of different levels, or amplitudes, and specific number of lengths, usually expressed as minimum integer and maximum integer length. However, the disclosed codes do not have properties that enable errors to be controlled. What is needed is a multilevel modulation code that includes error control.

Another multi-level modulation code is described in U.S. Pat. No. 5,537,382 Partial Response Coding for a Multilevel Optical Recording Channel (1996). The disclosed code requires a complex coding strategy that involves typical equalization issues faced by partial response codes. It would be useful if an approach could be developed that would provide a simpler decoding strategy.

As described above, if an effective, simple multi-level modulation code with error control could be developed, then the efficient storage of digital information on a multi-level optical disc would be facilitated. In addition, it should also be noted that multiple data levels have also been explored for use in data transmission systems such as those used in communication technologies including cellular telephones, modems, and fiber optic networks. These systems use a variety of encoding schemes including binary coding and quadrature amplitude encoding. In such systems, as in multilevel optical storage systems, an effective multi-level modulation coding scheme that controls errors is needed.

SUMMARY OF THE INVENTION

Accordingly, a two-tier modulation code that allows the recovery of data within acceptable error limits is disclosed. The first tier of modulation coding is a direct coding stage that reduces the incidence of errors by reducing the number of information states, thus increasing the difference between the signal levels corresponding to those information states. The second tier of modulation coding maps data onto a greater number of information states but the sequences of information states produced by the second tier is restricted by an error correction code. The differences between the allowed sequences are chosen so that errors are minimized. The modulation code disclosed is adaptable to take advantage of improvements in the number of information states stored on a mark.

It should be appreciated that the present invention can be implemented in numerous ways, including as a process, an apparatus, a system, a device, a method, or a computer readable medium. Several inventive embodiments of the present invention are described below.

A system and method are disclosed for modulation encoding data for storage or transmission on a multilevel medium. The method includes encoding a first portion of data using a first tier modulation code. The first tier modulation code maps a first portion of the data onto a first set of symbols. A second portion of data is encoded using a second tier modulation code. The second tier modulation maps the second portion of the data onto a second set of symbols. The second tier modulation code has error correcting characteristics. A third set of symbols is determined based on the first set of symbols and the second set of symbols. The third set of symbols is suitable to determine nominal read signal levels from a multilevel medium. Improved error characteristics are realized for encoding data for storage or transmission on a multilevel medium.

In one embodiment, encoding the first portion of data further includes selecting subsets of write symbols from a set of write symbols. Encoding the second portion of data includes determining selection indices for the subsets of write symbols. The third set of symbols are determined by using the selection indices to select write symbols from the subsets of write symbols. The sequences of determined selection indices are restricted to a set of allowed sequences of selection indices. The allowed sequences of selection indices may be determined by a Reed-Muller code.

In certain embodiments, input data is partitioned into a first portion of data and a second portion of data for encoding using the two tiers of modulation. The modulation encoding method is applied to a PDM disc and the recordable locations are pits in some embodiments and the multilevel medium is a ML disc and the recordable locations are marks of different reflectivity in some embodiments.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Figure 1:
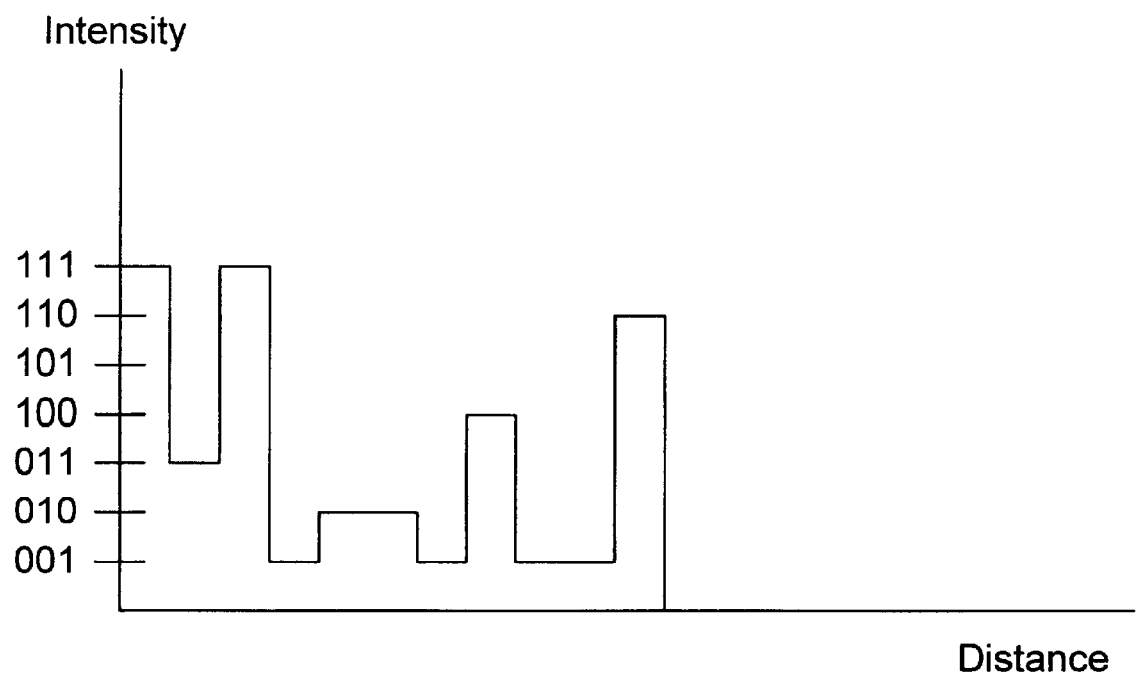
FIG. 1 is an illustration of an ideal signal read from a PDM disc that has I=8 different information states.

Reference will now be made in detail to the preferred embodiment of the invention. An example of the preferred embodiment is illustrated in the accompanying drawings. While the invention will be described in conjunction with that preferred embodiment, it will be understood that it is not intended to limit the invention to one preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In one embodiment, a block modulation code that works with fixed length marks addresses clock recovery, tracking and focus issues at least as well as previously implemented run length limited (RLL) codes. RLL codes are codes which have minimum and maximum constraints placed on the number of allowed sequential symbols. For example, in CD systems, the channel bits are restricted to patterns which have at least 2 zero bits and at most 10 zero bits between each pair of one bits.

The modulation code described herein includes a first tier direct modulation code that maps data directly to sets of symbols that correspond to mark signal levels that are spaced apart by an amount greater than a minimum resolvable mark signal level difference. A second tier error correcting modulation code is used to encode and recover data encoded in smaller mark signal level differences. In one embodiment, the second tier modulation code selects a symbol from each of the sets of symbols determined by the first tier modulation code. The two tier modulation code provides a flexible architecture that can be adapted to changes in the accuracy of disc writing and reading techniques as they are developed.

In the embodiment described above, the first tier of modulation starts with a partitioning of all possible symbols or information states of the system into a number of subsets. One of the subsets is chosen by the first tier of modulation coding. The second tier modulation code selects a symbol from the symbol subset selected by the first tier modulation code. The symbol selected by the second tier modulation code is then stored on a multilevel media as a mark or else transmitted over a multilevel transmission media.

Each information state corresponds to an expected signal level that will be read from a mark. The number of possible information states is determined based on the ability of the system to resolve signal levels which differ by small amounts. The second tier of encoding maps data onto all of the possible information states. Noise in the system may make it difficult to properly distinguish information states that correspond to signal levels that differ by only a small amount. The second tier code, therefore, selects sequences of symbols in a manner that enables errors to be corrected.

In one embodiment, change (or not) of the signal level output from the first tier of modulation by one minimum level spacing is used to encode data in the second tier. In other embodiments, change (or not) of the signal level by more than one level is used in the second tier. It is also possible to map the set of first tier signal levels (or symbols) to a set of other signal levels (or symbols) within the possible range of signals. The number of possible data sequences in the second tier encoding is again greater than the number of allowed data sequences, and the allowed data sequences are chosen to be dissimilar so that they can be properly identified.

A two tier modulation encoding scheme can be better understood by referring to the following example. Consider a disc reading and writing technology which reads and writes 12 different signal levels or information states (I=12) on a ML or PDM disc. Suppose that the dynamic range of signal levels obtained when the disc is read is adjusted to be between 0.0 and 1.20 volts. For the purpose of this example, we will assume that the nominal output signal levels corresponding to different information states are linearly determined to be 0.05, 0.15, 0.25, 0.35, 0.45, 0.55, 0.65, 0.75, 0.85, 0.95, 1.05, and 1.15 so that output signal levels of 0.0–0.1 volts may be read as information state #1, 0.1–0.2 volts may be read as information state #2, etc. In other embodiments, other schemes including nonlinear schemes for setting the boundaries between signal levels corresponding to different information states are used.

The probability of error in reading the signal level of a mark on such a disc may be determined by measuring, under normal reading and writing conditions, the standard deviation of the signal level of a mark or marks of the same information state. If, for example, the standard deviation in reading a mark is 0.025 volts, then it is likely that when information state #10 is written with a nominal signal level of 0.95 volts, the signal level read back will likely be between 0.90 and 1.00 volts (a range of plus or minus two standard deviations). For normal noise statistics, it will lie in that range 95% of the time so that the error rate will be 5% and 1 symbol out of every 20 symbols will be expected to be wrong.

The probability of misreading an information state might be higher than desired under such circumstances. One solution to improving the error rate would be to decrease the number of information states over the same dynamic range. For example, if only half the number of information states were allowed to be written, and the standard deviation in reading levels were still 0.025 volt but the range that corresponded to each information state would be twice as large; 0.0–0.2 volts would then correspond to information state A, which includes the entire range used by the formerly defined information states #1 and #2. The range between 0.2 and 0.4 would correspond to information state B which includes the entire range used by the formerly defined information states #3 and #4. The incidence of errors in reading these levels would be significantly reduced. In fact, under the above standard deviation there would be only one error expected in 30,000 symbols. The density of stored information, however, would be decreased, and the efficiency of storage of such a system would be reduced because the system would not take advantage of the ability of the technology to record some information by modulating the pits more finely, even if such modulation would result in too large an error rate.

This problem is solved by providing two tiers of modulation encoding. A first tier of modulation coding maps data onto a set of first tier modulation coding symbols each of which corresponds to a different subset of all possible symbols. The first tier modulation coding allowed symbol subsets tend to be spaced further apart than all the possible symbols so that error incidence is reduced. A second tier of modulation coding maps the first tier symbols onto the second tier symbols. The second tier symbols include all possible symbols and so a greater number of information states may be represented by the second tier modulation coding symbols than by the first tier modulation coding symbols. The second tier modulation coding does, however, constrain the possible sequences of information states or symbols so that errors may be detected and corrected. When the disc is read, the sequence restrictions of the second tier of modulation coding are taken into account and used to correct errors before the first tier of modulation is decoded. The first tier modulation code also includes some error detection or correction as well.

In one embodiment, the first tier modulation code encodes a first group of data by selecting a sequence of symbol subsets where each symbol subset includes a subset of the possible symbols. The second tier modulation code then selects one symbol from each of the symbol subsets. The sequence of symbols selected from each subset is restricted by an error correcting code. The symbol selected by the second tier of modulation is stored in the mark.

Returning to the example given above with 12 possible information states, the first tier of modulation may map a first set of data onto one of six subsets of the possible 12 symbols corresponding to the 12 information states. For example, the six subsets may be defined as subset A=(0,1), B=(2,3), C=(4,5), D=(6,7), E=(8,9), and F=(10,11). Each of the symbols in the subsets corresponds to one of the nominal signal levels described above, so that symbols 0, 1, 2, 3, 4, 5, 6, 7, 8, 9, 10, and 11 correspond to nominal signal levels 0.05, 0.15, 0.25, 0.35, 0.45, 0.55, 0.65, 0.75, 0.85, 0.95, 1.05, and 1.15, respectively. The first tier of code chooses one of the subsets, for example, set D. The second tier code then selects which symbol in the set is actually written to the disc. For example, if the second element of set D is selected, then 7 is written to the disc in the form of a mark that is expected to produce a nominal signal level corresponding to the symbol 7 when it is read. Thus, the first tier of modulation outputs a code consisting of a sequence of sets of possible symbols. The second tier of modulation selects a symbol from each set. Preferably, the sets of symbols are chosen so that the nominal signals output from each set tend to be further spaced apart than the minimum mark signal difference. In the example given above, this is true because the average of the nominal signal levels for the elements of each set A,B,C,D,E and F are 0.1, 0.3, 0.5, 0.7, 0.9, and 1.1 volts, respectively.

The second tier of modulation then selects the correct symbol from each set. The selected symbol is the symbol written to the disc in such a way as to produce the nominal signal value for that symbol when the disc is read. As described above, the sequence of selections of symbols from each symbol set is restricted using an error correcting sequence. During the read process, the reader first compares the raw read data to the allowed sequences and in one embodiment corrects the read data so that it corresponds to the most likely allowed sequence of second tier selections. The second tier of modulation is decoded by determining the sequences of selections of either the first or second symbol in each symbol set and the first tier of modulation is decoded by determining the sequence of symbol sets selected.

Returning to the example, if the first tier symbol is D, (6,7) and the second tier symbol is 1 (from 0,1), then the recorded symbol is 7 and the record level is 0.75. Now if, upon reading, a noise of 0.08 is added, the received level is 0.83. This level is 0.08 from 0.75 but −0.02 from 0.85 so the nearest nominal signal level is 0.85 and the symbol 8 will be selected. This is the first member of E (second tier value 0) so that both the first and second tier symbols are wrong. However, the second tier symbols are protected by an error correcting code. If the number of marks in error is within the error correcting capability of the second tier code, the second tier symbol will be corrected to the value 1. Therefore the candidate first tier symbols are D (second level 0.75) and E (second level 0.95). The read level, 0.83 is 0.08 from 0.75 and −0.12 from 0.95 so the nearest is 0.75, and the first tier selects the correct symbol, D. In terms of the standard deviation mentioned above, this scheme, with a second tier error correcting code that can correct in the presence of a 1 in 20 error rate, can reduce the error rate to less than 1 in 30,000.

In different embodiments, there can be any number of subsets—6, 4, 3, or 2, for example, in the 12 level system considered above with 2, 3, 4, and 6 elements in each set, respectively. The sets are arranged many different ways in different embodiments. In one embodiment, four subsets are defined with AA=(0,4,8), BB=(1,5,9), CC=(2,6,10), and DD=(3,7,11).

In this embodiment, the two tier approach allows the second tier to select one of the four subsets, AA, BB, CC, or DD. The first tier selects a member of the selected subset. Again, the second tier has an error correcting code to limit the possibility of an error, thus assuring that the correct subset is selected upon decoding. The first tier then has a choice of symbols within that subset and these have a maximum separation.

In other embodiments, the two tier approach allows the first tier to encode information with symbols that tend to be separated from each other by greater than the minimum symbol difference. The second tier, then, by having some error correction properties can allow for the finer distinction between members of a given set.

The encoding need not be just a mapping from information bits to single marks. Returning again to the 12 level example given above, if 6 symbol subsets are allowed for the first tier of modulation, then two marks can be used to contain 36 information states. These states can be thought of as storing 5 bits which implies $2^5=32$ information states worth of information.

Once the subset of symbols is chosen by the first tier of modulation, the second tier of modulation maps to another set of symbols. The second tier of modulation can be thought of as fine tuning the mark level—shifting the level to either 6 or 7 (as it does with set D above). Choosing the first state (6) could be thought of as representing a 0, and choosing the second state (7) could be thought of as representing a 1. One method of introducing error correction properties into the second tier code is to only allow certain sequences of 0's and 1's in this second tier code.

Since, as mentioned earlier, the error rate of the reading and writing system may not be acceptable when mark signal level differences are as small as the defined minimum resolvable mark signal level difference, an error control coding system is used for the second level of modulation to constrain the sequences of data that are allowed to be written by the second tier. In one embodiment, a Reed-Muller error correction code is used to restrict the allowed sequences and to recover correct data when errors are made in reading the minimum resolvable mark signal level differences. Reed-Muller codes are block codes. They operate on a fixed number of bits in a block. They are powerful codes that are able to improve error rates. They may be efficiently decoded by a reader and may readily be implemented on commercial circuitry. A Reed-Muller encoder accepts a small number of bits, for example, 5 bits and encodes them into a larger number of bits, for example, 16 bits. In this example, the larger block of bits contains $2^{16}$ possible sequences, but of the possible sequences only $2^5$ are allowed sequences representing the 5 stored bits.

Reed-Muller codes are designated by a notation that includes 3 numbers. The first number is the number of bits in the sequence onto which the input bits are mapped. The second number is the number of input bits. The third number is the minimum number of bits difference between the allowed sequences.

An example of a Reed-Muller code would be a (16,5,8) code. The (16,5,8) code maps 5 input bits (d0, d1, d2, d3, d4) to a 16 bit sequences as follows:
output data=b0*d0+b1*d1+b2*d2+b3*d3+b4*d4
where the addition and multiplication follow the binary modulo 2 rules and:
b0=1111111111111111
b1=0101010101010101
b2=0011001100110011
b3=0000111100001111
b4=0000000011111111

So, if the input bits are (0, 0, 1, 0, 1), then the output data is 0011001111001100. The strength of these codes is that all codewords are 8 bits apart so that they are easily distinguished from each other.

For example, consider writing a block of 16 marks using four first tier subsets A, B, C, and D, where each subset includes 2 elements and A=(0,1), B=(2,3), C=(4,5), and D=(6,7). 2 bits per mark are stored using the first tier modulation code. Those 2 bits are used to select one of the four subsets of the first tier. For example, 00 could represent A, 01 could represent B, 10 could represent C, and 11 could represent D. So, if the 32 bits (00, 11, 01, 10, 00, 11, 01, 00, 10, 01, 11, 10, 11, 00, 11, 10) are encoded, the first tier produces the subsets A, D, B, C, A, D, B, A, C, B, D, C, D, A, D, and C.

Next, the second tier chooses symbols within the subsets A, B, C, and D. 5 bits select the Reed-Muller code word of length 16. Each of the 16 bits individually selects a symbol within a symbol. For example, the 5 bit Reed-Muller code word 00101 gives 0011001111001100. The value of the $i^{th}$ bit in the second tier code word indicates which element of the $i^{th}$ subset to store on the disc. For example, the first bit may choose the first element in subset A, which is 0.

Generally, the ability of the Reed-Muller code to detect and correct errors increases as more bits are included in the sequence or fewer sequences are allowed to represent data. The strength of the Reed-Muller code can be altered depending on the expected incidence of errors for different reading and writing systems.

It should be noted that in the described example, only one minimum resolvable mark signal level difference is used for the second tier of code. In other embodiments, the first tier of coding might encode in any subset of information states or subset of symbols with the remaining states or symbols used by the second tier of modulation.

Figure 2:
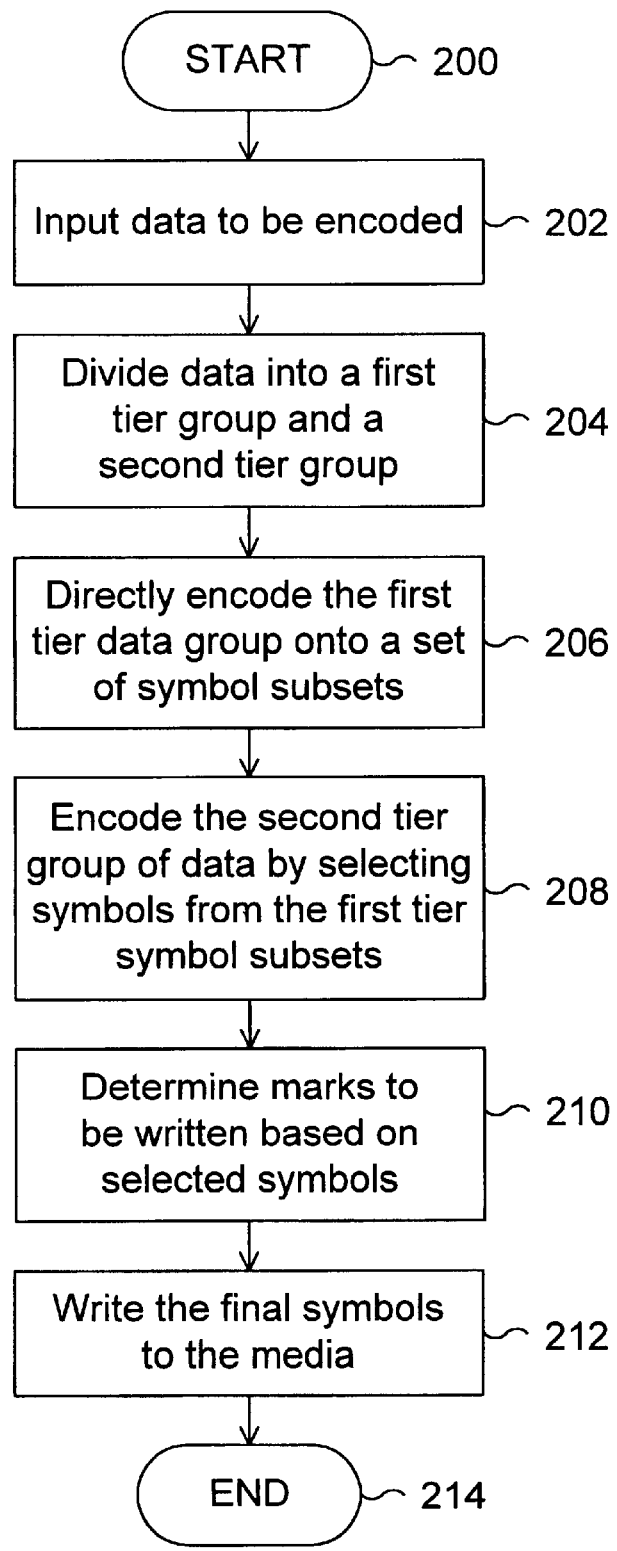
FIG. 2 is a flow chart illustrating a process for storing data using a two tiered code implemented in one embodiment.

FIG. 2 is a flow chart illustrating a process for storing data using a two tiered code implemented in one embodiment. The process starts at 200. In a step 202, the data that is being coded is input. Next, in a step 204, the data is partitioned into a first tier set of data to be encoded by the first tier modulation code and a second tier set of data to be encoded by the second tier modulation code. The first tier directly encodes the first tier set of data by mapping the data to a set of symbol subsets in a step 206. In the example given above, the symbol subsets where the subsets A, B, C, D, E, and F.

The second tier modulation code encodes the second tier set of data by selecting symbols from the symbol subsets selected by the first tier modulation code in a step 208. In the example given above, the second tier of modulation mapped the second set of data onto a sequence of 1's and 0's allowed by a Reed-Muller code. Each 1 and 0 of the Reed-Muller code was used to select either the first or the second element from each two element set that was selected by the first tier of modulation. The symbols selected by the second tier modulation code are used to determine the marks that are written on the disc in a step 210. The marks are written to the media in step 212 and the process ends at 214.

Returning again to the 12 level example given above, if the first tier of modulation mapped the first tier data set onto the symbols CDCB and the second tier of modulation mapped the second tier data set onto the Reed-Muller allowed sequence 1001, then the final symbols selected would be 5, 6, 4, 3. The first 1 in the Reed-Muller sequence would be used to select the second element of symbol set C (5) and the first 0 in the Reed-Muller sequence would select the first element of symbol set D (6) and so on.

Figure 3:
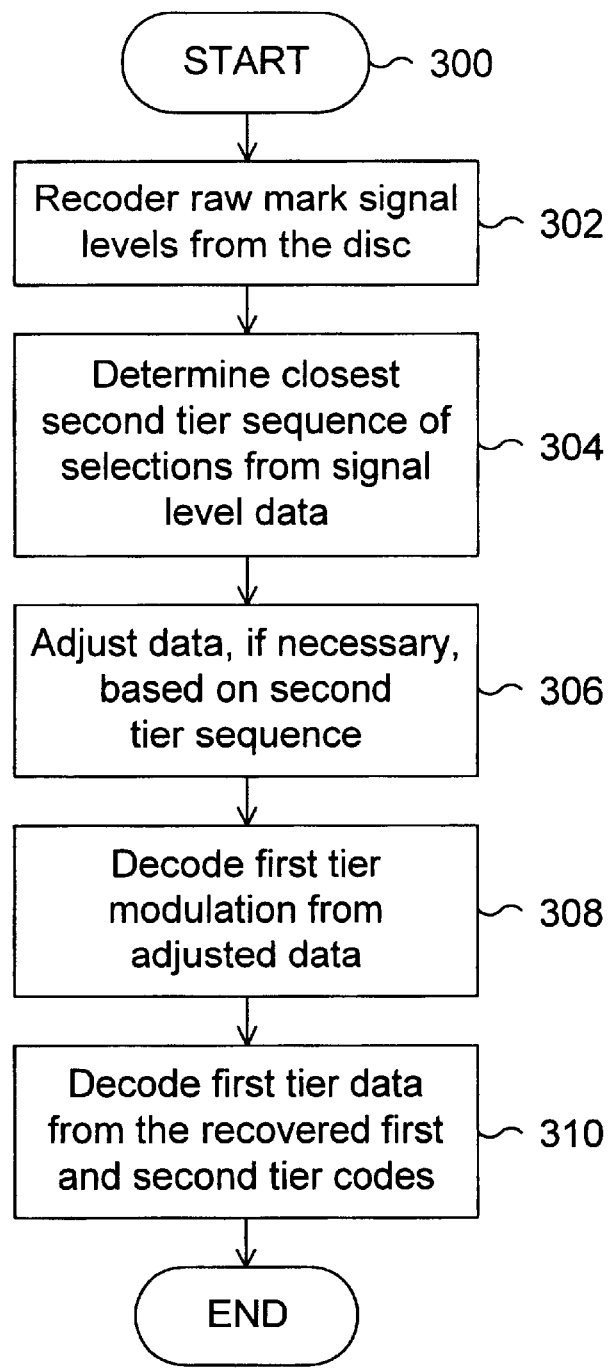
FIG. 3 is a flow chart illustrating a process for reading data encoded using a two tiered code in one embodiment.

FIG. 3 is a flow chart illustrating a process for reading data encoded using a two tiered code in one embodiment. For the purpose of clarity, the following description will refer to the symbol subsets A, B, C, D, E, and F from the example above. The process starts at 300. In a step 302, the raw mark signal level values are recovered from the disk. Next, in a step 304, the most likely sequence of second tier selections is chosen (and saved) given the sequence of read mark signal level values. In certain instances, this may require interpreting certain raw mark signal level values as indicating a different symbol subset than they initially appear to indicate. For example, suppose that a raw signal level of 0.61 is detected. This signal level generally would be decoded as symbol 6 in symbol subset D with subset D indicating data encoded by the first tier of modulation and the selection of the first symbol in subset D, 6, being a selection in a sequence of selections that is decoded to determine the data encoded by the second tier of modulation.

For the purpose of this example, assume that the nominal signal level recorded for the disc location was actually 5.5, corresponding to symbol 5 which is the second symbol in subset C. When the second tier modulation is decoded, then the selection of the first element in subset D would cause an invalid second tier sequence to be recovered. Assuming that additional errors do not prevent the error correcting code used by the second tier of modulation from functioning properly, the error correction code would cause the signal level to be interpreted as the nearest second element of a subset, which in this case is the second element of subset C, the symbol 5. This occurs in a step 306 where the signal level data is adjusted, if necessary, so that an allowed second tier sequence is obtained. Next, in a step 308, the first tier modulation code is recovered from the adjusted signal level data. This is done by noting the subset in which each symbol corresponding to the adjusted signal level data belongs. Finally, in a step 310, the original data is decoded from the recovered first and second tier codes.

Thus, the data to be stored is partitioned into two groups. The first tier modulation group is mapped onto a set of symbols by the first tier encoding step and the second tier modulation group of data is mapped onto a second set of symbols by the second tier encoding step. Both groups of data are recovered from the raw mark signal levels that are read by recovering the second tier of encoding, correcting the symbols interpreted from the read signal levels according to the second tier error correcting code, and recovering the first tier code by identifying the first tier code subset in which each corrected symbol belongs.

Figure 4A:
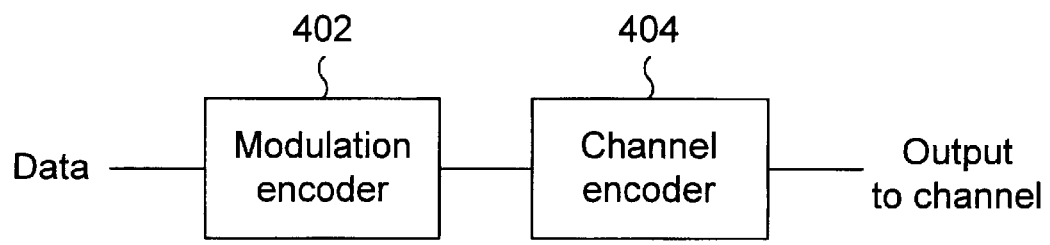
FIG. 4A is a block diagram illustrating a system for encoding input data for either a data storage channel or a data transmission channel.
Figure 5:
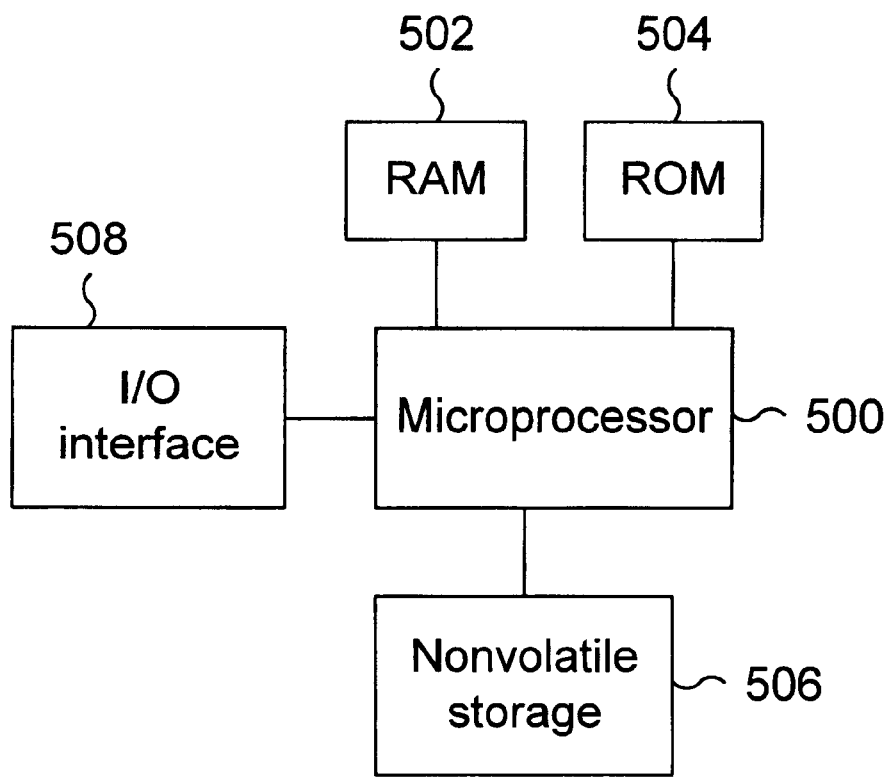
FIG. 5 is a block diagram illustrating a typical computer system that may be used to implement the modulation encoder and decoder.

FIG. 4A is a block diagram illustrating a system for encoding input data for either a data storage channel or a data transmission channel. Data is input to a modulation encoder 402 that performs the two tier encoding described above and the output of the modulation encoder is input to a channel encoder 404 that encodes the data for storage or transmission on the channel. In some embodiments, the channel encoding is combined with the modulation encoding. The modulation encoder 402 may be implemented on a microprocessor system as shown in FIG. 5. In one embodiment, modulation encoder 402 is implemented on an application specific integrated circuit (ASIC).

Figure 4B:
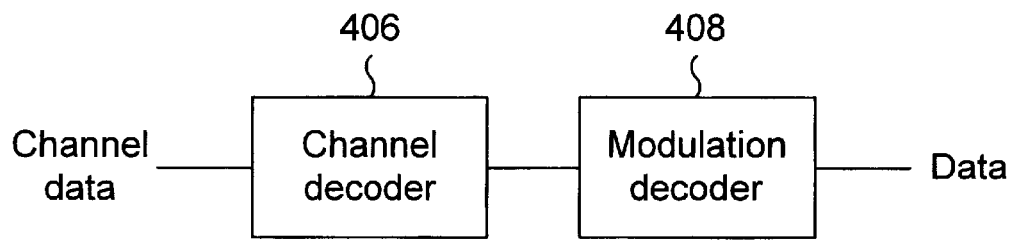
FIG. 4B is a block diagram illustrating a system for decoding data read from storage media or received from a communication line.

FIG. 4B is a block diagram illustrating a system for decoding data read from storage media or received from a communication line. The channel data is input into a channel decoder 406 and the output of channel decoder 406 is input into a modulation decoder 408. The decoded data is output from modulation decoder 408.

FIG. 5 is a block diagram illustrating a typical computer system that may be used to implement the modulation encoder and decoder. A microprocessor 500 is connected to a RAM 502 and a ROM 504. Microprocessor 500 may also be connected to non-volatile storage 506. An I/O interface 508 transfers data to be encoded or decoded. As noted above, the modulation encoder and modulation decoder may also be implemented using an ASIC.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, although a two-tier code has been described and is preferred, it would also be possible to include more than two tiers within the spirit and scope of this invention. The two tier combination of first tier coding and a second tier Reed-Muller code has been described is preferred because it has error correction characteristics and may be readily implemented. However, other two tier codes can be envisioned that take advantage of layering a first tier modulation code and a second tier error correction code.

For example, a two tier scheme has been developed that groups the first tier sets into other pairs than those listed in the above example. For 8 defined mark signal levels, the defined sets are A3=(0,4), B3=(1,5), C3=(2,6) and D4=(3,7). The first tier modulation maps data onto the groups, or sequences of the groups, and the second tier stores additional data by selecting one of the elements of each group, or sequences of elements of each group.

It should also be noted that in other embodiments, the two tiered code disclosed herein may be used with other systems with multiple levels of channel carrying capacity. Examples of the variable quantity measured include optical signal strength, electrostatic charge, magnetic signal strength, optical luminescence, and timing resolution. Specifically, the two tiered code may be used to encode data for storage in a multiple level EPROM or EEPROM. In optical data storage systems, the two tiered code may be used with an optical system that produces variable levels of optical response using variable mark width, variable mark reflectivity, or variable mark depth. In yet another embodiment, the two tiered code is used in a system that uses photoluminescence to store a level of excitation in a chemical medium. When the medium is triggered, the amount of light released by the optical medium is proportional to the signal originally written. The two tiered code may also be used with information transmission methods involving changes in timing, particularly with variants of Pulse Position Modulation (PPM).

Accordingly, the present embodiments are to be considered as illustrative and not restrictive, and the invention is not to be limited to the details given herein, but may be modified within the scope and equivalents of the appended claims.

What is claimed is:

1. A computer program product for modulation encoding data for storage on a multilevel medium, the computer program product being embodied in a computer readable medium and comprising computer instructions for:
   encoding a first portion of data using a first tier modulation code wherein the first tier modulation code maps a first portion of the data onto a first set of symbols; and
   encoding a second portion of data using a second tier modulation code wherein the second tier modulation maps the second portion of the data onto a second set of symbols and wherein the second tier modulation code has error correcting characteristics, and
   determining a third set of symbols based on the first set of symbols and the second set of symbols, the third set of symbols being suitable to determine nominal read signal levels from a multilevel medium;
   wherein improved error characteristics are realized for encoding data for storage in a multilevel medium.

2. A computer program product for modulation encoding data for storage on a multilevel medium as recited in claim 1 wherein encoding the first portion of data further comprises selecting subsets of write symbols from a set of write symbols.

3. A computer program product for modulation encoding data for storage on a multilevel medium as recited in claim 2 wherein encoding the second portion of data comprises determining selection indices for the subsets of write symbols.

4. A computer program product for modulation encoding data for storage on a multilevel medium as recited in claim 3 wherein the third set of symbols are determined by using the selection indices to select write symbols from the subsets of write symbols.

5. A computer program product for modulation encoding data for storage on a multilevel medium as recited in claim 3 wherein the determined selection indices are restricted to a set of allowed sequences of selection indices.

6. A computer program product for modulation encoding data for storage on a multilevel medium as recited in claim 1 wherein the allowed sequences of selection indices are determined by a Reed-Muller code.

7. A computer program product for modulation encoding data for storage on a multilevel medium as recited in claim 1, the computer program product further comprising computer instructions for partitioning input data into the first portion of data and the second portion of data.

8. A computer program product for modulation encoding data for storage on a multilevel medium as recited in claim 1 wherein the multilevel medium is a PDM disc having recordable locations that are pits.

9. A computer program product for modulation encoding data for storage on a multilevel medium as recited in claim 1 wherein the multilevel medium is a ML disc having recordable locations that are marks of different reflectivity.

10. A computer program product for modulation encoding data for transmission on a multilevel medium, the computer program product being embodied in a computer readable medium and comprising computer instructions for:
    encoding a first portion of data using a first tier modulation code wherein the first tier modulation code maps a first portion of the data onto a first set of symbols; and encoding a second portion of data using a second tier modulation code wherein the second tier modulation maps the second portion of the data onto a second set of symbols and wherein the second tier modulation code has error correcting characteristics, and determining a third set of symbols based on the first set of symbols and the second set of symbols, the third set of symbols being suitable to determine nominal signal levels for a multilevel medium;

wherein improved error characteristics are realized for encoding data for transmission on a multilevel medium.

11. A computer program product for modulation encoding data for transmission on a multilevel medium as recited in claim 10 wherein encoding the first portion of data further comprises selecting subsets of write symbols from a set of write symbols.

12. A computer program product for modulation encoding data for transmission on a multilevel medium as recited in claim 11 wherein encoding the second portion of data comprises determining selection indices for the subsets of write symbols.

13. A computer program product for modulation encoding data for transmission on a multilevel medium as recited in claim 12 wherein the third set of symbols are determined by using the selection indices to select write symbols from the subsets of write symbols.

14. A computer program product for modulation encoding data for transmission on a multilevel medium as recited in claim 13 wherein the determined selection indices are restricted to a set of allowed sequences of selection indices.

15. A computer program product for modulation encoding data for transmission on a multilevel medium as recited in claim 14 wherein the allowed sequences of selection indices are determined by a Reed-Muller code.

16. A computer program product for modulation encoding data for transmission on a multilevel medium as recited in claim 10, the computer program product further including computer instructions for partitioning input data into the first portion of data and the second portion of data.

17. A system for modulation encoding data for storage on a multilevel medium comprising:

a modulation encoder configured to:

encode a first portion of data using a first tier modulation code wherein the first tier modulation code maps a first portion of the data onto a first set of symbols;

encode a second portion of data using a second tier modulation code wherein the second tier modulation maps the second portion of the data onto a second set of symbols and wherein the second tier modulation code has error correcting characteristics, and determine a third set of symbols based on the first set of symbols and the second set of symbols, the third set of symbols being suitable to determine nominal read signal levels from a multilevel medium;

wherein improved error characteristics are realized for encoding data for storage in a multilevel medium.

18. The system for modulation encoding data for storage as recited in claim 17 wherein encoding the first portion of data further comprises selecting subsets of write symbols from a set of write symbols.

19. The system for modulation encoding data for storage as recited in claim 18 wherein encoding the second portion of data comprises determining selection indices for the subsets of write symbols.

20. The system for modulation encoding data for storage as recited in claim 19 wherein the third set of symbols are determined by using the selection indices to select write symbols from the subsets of write symbols.

21. The system for modulation encoding data for storage as recited in claim 19 wherein the determined selection indices are restricted to a set of allowed sequences of selection indices.

22. The system for modulation encoding data for storage as recited in claim 17 wherein the allowed sequences of selection indices are determined by a Reed-Muller code.

23. The system for modulation encoding data for storage as recited in claim 17, wherein the modulation encoder is further configured to partition input data into the first portion of data and the second portion of data.

24. The system for modulation encoding data for storage as recited in claim 17 wherein the multilevel medium is a PDM disc having recordable locations that are pits.

25. The system for modulation encoding data for storage as recited in claim 17 wherein the multilevel medium is a ML disc having recordable locations that are marks of different reflectivity.

26. The system for modulation encoding data for storage as recited in claim 17 wherein the multilevel medium comprises a storage channel and further comprising a channel encoder configured to encode the data for storage on the channel.

27. The system for modulation encoding data for storage as recited in claim 26 wherein the modulation encoder and the channel encoder comprise a single combined encoder.

28. The system for modulation encoding data for storage as recited in claim 17 wherein the modulation encoder is implemented on a microprocessor.

29. The system for modulation encoding data for storage as recited in claim 17 wherein the modulation encoder is implemented on an application specific integrated circuit (ASIC).

30. A system for modulation encoding data for transmission on a multilevel medium comprising:

a modulation encoder configured to:

encode a first portion of data using a first tier modulation code wherein the first tier modulation code maps a first portion of the data onto a first set of symbols;

encode a second portion of data using a second tier modulation code wherein the second tier modulation maps the second portion of the data onto a second set of symbols and wherein the second tier modulation code has error correcting characteristics, and determine a third set of symbols based on the first set of symbols and the second set of symbols, the third set of symbols being suitable to determine nominal read signal levels from a multilevel medium;

wherein improved error characteristics are realized for encoding data for transmission on a multilevel medium.

31. The system for modulation encoding data for transmission as recited in claim 30 wherein encoding the first portion of data further comprises selecting subsets of write symbols from a set of write symbols.

32. The system for modulation encoding data for transmission as recited in claim 31 wherein encoding the second portion of data comprises determining selection indices for the subsets of write symbols.

33. The system for modulation encoding data for transmission as recited in claim 32 wherein the third set of symbols are determined by using the selection indices to select write symbols from the subsets of write symbols.

34. The system for modulation encoding data for transmission as recited in claim 33 wherein the determined selection indices are restricted to a set of allowed sequences of selection indices.

35. The system for modulation encoding data for transmission as recited in claim 34 wherein the allowed sequences of selection indices are determined by a Reed-Muller code.

36. The system for modulation encoding data for transmission as recited in claim 30 wherein the modulation encoder is further configured to partition input data into the first portion of data and the second portion of data.

37. The system for modulation encoding data for transmission as recited in claim 30 wherein the multilevel medium comprises a transmission channel and further comprising a channel encoder configured to encode the data for transmission on the channel.

38. The system for modulation encoding data for transmission as recited in claim 37 wherein the modulation encoder and the channel encoder comprise a single combined encoder.

39. The system for modulation encoding data for transmission as recited in claim 30 wherein the modulation encoder is implemented on a microprocessor.

40. The system for modulation encoding data for transmission as recited in claim 30 wherein the modulation encoder is implemented on an application specific integrated circuit (ASIC).

\* \* \* \* \*